US009819320B1

(12) United States Patent
Hoff et al.

(10) Patent No.: US 9,819,320 B1
(45) Date of Patent: Nov. 14, 2017

(54) COAXIAL AMPLIFIER DEVICE (71) Applicants: Brad W. Hoff, Albuquerque, NM (US);
David M. French, Portland, OR (US)

(72) Inventors: Brad W. Hoff, Albuquerque, NM (US);
David M. French, Portland, OR (US)

(73) Assignee: The Government of the United States of America as Represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 15/414,535

(22) Filed: Jan. 24, 2017

Related U.S. Application Data

(60) Provisional application No. 62/325,932, filed on Apr. 21, 2016.

(51) Int. Cl.
| H03F 1/00 | (2006.01) |
| H03F 3/58 | (2006.01) |
| H01J 25/34 | (2006.01) |
| H01J 23/04 | (2006.01) |
| H01J 23/06 | (2006.01) |
| H01J 23/24 | (2006.01) |

(52) U.S. Cl.
CPC .............. *H03F 3/58* (2013.01); *H01J 23/04* (2013.01); *H01J 23/06* (2013.01); *H01J 23/24* (2013.01); *H01J 25/34* (2013.01)

(58) Field of Classification Search
CPC .................. H03F 1/00; H03F 3/58; H03F 3/54
USPC ............................................. 330/43, 44, 63
See application file for complete search history.

(56) References Cited

U.S. PATENT DOCUMENTS

| 2,603,772 | A | * | 7/1952 | Field | H01J 25/34 |
| | | | | | 315/3 |
| 2,626,371 | A | * | 1/1953 | Barnett | H01J 23/30 |
| | | | | | 313/286 |
| 2,645,737 | A | | 7/1953 | Field | |
| 2,740,917 | A | * | 4/1956 | Haeff | H01J 25/20 |
| | | | | | 315/3.6 |
| 3,258,706 | A | * | 6/1966 | Sturrock | H01J 23/11 |
| | | | | | 315/3.5 |
| 4,296,354 | A | * | 10/1981 | Neubauer | H01J 23/30 |
| | | | | | 315/3.5 |

(Continued)

FOREIGN PATENT DOCUMENTS

CN           200965860 Y        10/2007

OTHER PUBLICATIONS

L. M. Field, "Some Slow-Wave Structures for Traveling-Wave Tubes," Proceedings of the I. R. E., Jan. 1949.

(Continued)

*Primary Examiner* — Henry Choe
(74) *Attorney, Agent, or Firm* — James M. Skorich (57) ABSTRACT

A coaxial amplifier having at least one electron beam is provided. The amplifier may include a conductive rod, a plurality of parallel discs on the rod, a cathode array for producing at least one electron beam. When a plurality of electron beams are formed they are arranged in an annular configuration around said rod and disks, and directed along said rod and coaxially thereof. A first waveguide may apply electromagnetic wave energy to one end of said disc and rod assembly to induce propagation of said energy along said assembly. A second waveguide may extract the amplified electromagnetic energy from the other end of the disc and rod assembly.

20 Claims, 8 Drawing Sheets

(56) References Cited

U.S. PATENT DOCUMENTS

| | | | |
|---|---|---|---|
| 4,621,218 A | | 11/1986 | Jasper, Jr. et al. |
| 4,733,131 A | | 3/1988 | Tran et al. |
| 4,820,688 A | * | 4/1989 | Jasper, Jr. ............. H01J 23/165 |
| | | | 315/3.5 |
| 4,912,366 A | | 3/1990 | Dionne |

OTHER PUBLICATIONS

L. Yue, W. Wang, Y. Gong, K. Zhang, "Analysis of Coaxial Ridged Disk-Loaded Slow-Wave Structures for Relativistic Traveling Wave Tubes," IEEE Transactions on Plasma Science, vol. 32, No. 3, Jun. 2004.

D. Shiffler, M. Ruebush, M. Haworth, R. Umstattd, M. LaCour, K. Golby, D. Zagar, and T. Knowles, "Carbon velvet field-emission cathode," Review of Scientific Instruments, 73, 4358 (2002).

* cited by examiner

COAXIAL AMPLIFIER DEVICE

STATEMENT OF GOVERNMENT INTEREST

The conditions under which this disclosure was made are such as to entitle the Government of the United States under paragraph 1(a) of Executive Order 10096, as represented by the Secretary of the Air Force, to the entire right, title and interest therein, including foreign rights.

BACKGROUND OF THE DISCLOSURE

Technical Field

The present disclosure relates generally to amplification devices. More particularly, this disclosure relates to coaxial amplification devices. Specifically, this disclosure relates to coaxial amplification devices having the ability to apply electromagnetic wave energy to one end of an amplification device to induce propagation of the electromagnetic wave energy along the device coaxial with an electron beam propagation, and the ability to extract the electromagnetic wave energy at the other end of said amplification device.

Background Information

Amplifiers are a necessary component in a number of radio frequency (RF) systems, including radar transmitters, electronic warfare (EW) systems, and communication systems. Some general amplifier configurations have a disk-loaded, or "disk-on-rod," coaxial traveling wave tube (TWT). The concept of such an amplifier was originally described by L. M. Field in U.S. Pat. No. 2,645,737. Field, et. al. went on to publish on experimental testing of an X-band variant of a coaxial traveling wave tube with disk loading on the center conductor in the following reference {L. M. Field, "Some Slow-Wave Structures for Traveling-Wave Tubes," Proceedings of the I. R. E., January 1949}.

The center conductor of Field's device was supported by two coaxial couplers, one on the wave injection side and one on the extraction side, on which a electromagnetic wave was injected and extracted, respectively. The electromagnetic wave in Field's device was a TEM wave, which is a transverse mode of a beam of electromagnetic radiation that is a particular electromagnetic field pattern of radiation measured in a plane perpendicular (i.e., transverse) to the propagation direction of the beam.

In Field's disclosure, an annular electron beam, emitted from a thermionic cathode, was used to excite the slow wave structure. The spent beam was impacted on a metallic wall at the extraction end of the tube. Field's tube, as fabricated, had relatively low gain (only 5 dB of gain) due to much higher than expected losses in the slow wave structure (around −40 dB). The maximum output power observed for Field's tube was around 1.5 Watts.

Another coaxial amplifier was described by N. L. Dionne in U.S. Pat. No. 4,912,366. Dionne's amplifier utilized a set of helices as the amplification structure. The annular electron beam required by Dionne's device was generated using a thermionic cathode and operated at non-relativistic voltages. As is described in the following reference {A. S. Gilmour, Jr. "Klystrons, Traveling Wave Tubes, Magnetrons, Crossed-Field Amplifiers, and Gyrotrons," Artech House, Massachusetts (2011)} or any other standard amplifier textbook, helical amplifiers are not suitable for use at high powers, thus are not considered to be useful in relativistic amplifiers.

Yet another type of coaxial amplifier, utilizing a smooth rod center conductor and outer conductor with diaphragms, potentially driven by an annular relativistic beam is described by L. Yue in the following reference {L. Yue, W. Wang, Y. Gong, K. Zhang, "Analysis of Coaxial Ridged Disk-Loaded Slow-Wave Structures for Relativistic Traveling Wave Tubes," IEEE Transactions on Plasma Science, Vol. 32, No. 3, June 2004}. Because the Yue reference was intended as a theoretical study, there was no mention of practicalities required for building a device, such as how the center conductor might be supported or how the electron beam might be generated.

Multi-beam configurations have been proposed for use in other types of amplification tubes such as multi-beam klystrons (as described in U.S. Pat. No. 4,733,131), multi-beam coupled cavity traveling wave TWTs (as described in Chinese Patent No. CN 200965860 Y), and radial multiple beam gridded amplifiers (as described in U.S. Pat. No. 4,621,218). These devices, however, are distinctly different from each other and from disk-loaded coaxial TWTs in a number of important characteristics, including electromagnetic field configurations, gain-bandwidth product, and dispersive properties.

Issues continue to exists with amplification devices and their ability provide more simple, yet more robust connections between an amplifier tube body and a center disk-on-rod assembly. The present disclosure addresses these and other issues.

SUMMARY

The present disclosure utilizes a coaxial disk-loaded slow wave structure, supported at either end by connections to either coaxial transmission lines or waveguide impedance transformers. Instead of the annular electron beam utilized by Field, Dionne, and Yue, the present disclosure utilizes an annular array arrangement of individual solid electron beams, or "pencil beams." This beam arrangement allows for simpler, more robust connections between the amplifier tube body and the center disk-on-rod assembly. It also allows for the ability to more readily use full severs that allow the device to be split in such a way that electromagnetic coupling between sections of the device occurs through the AC current modulation of the electron beam. As described in the Gilmour Jr. reference or other standard amplifier textbooks, this allows for superior suppression of unwanted tube oscillations.

In one exemplary aspect, an embodiment of the present disclosure may provide a multiple beam, coaxial disk-loaded (or "disk-on-rod') traveling wave tube (TWT) amplifier. The center structure of this coaxial amplifier consists of a conductive rod and a plurality of disks spaced by distances less than their diameter. The outer wall of the coaxial structure is also to be made of a conductive material. If distributed loss is required in the device to suppress unwanted electromagnetic energy, the center structure or outer wall may be comprised of or may contain a layer of resistive material. Examples of some such resistive material include but are not limited to graphite or other forms of carbon, silicon carbide, or nichrome. The coaxial disk-loaded "slow wave" structure will support one or more electromagnetic modes that have a velocity less than the speed of light such that they may interact with the multiple electron beams.

The multiple beams are generated using a plurality of cathodes arranged in an annulus around the center disk-on-rod structure. These cathodes are positioned at a radius from the center of the device such that the electron beams emitted by the cathodes pass along and near to the outer diameter of the disks. The cathodes are also ideally angularly spaced such that the angular separation between each neighboring cathode is equal. At either end of the device, the amplification structure is connected to either a coaxial or other waveguide impedance transformer to allow for electromagnetic energy to be injected into the device at one end and extracted at the other. These coaxial or other waveguide connections are modified such that the array of electrons emitted from the cathode are not prevented from traveling along the disk-on-rod structure, as mentioned previously.

The electron beams interact electromagnetically with the RF electromagnetic wave traveling along the disk-on-rod slow wave structure in such a way that energy from the electron beam is transferred to the electromagnetic wave, thus causing amplification of the wave as it travels through the amplification structure.

All of the exemplary embodiments disclosed herein are designed to be compatible with field emission and explosive emission cathodes, which typically operate at voltages much greater than thermionic cathodes, therefore allowing for relativistic, high current electron beams allowing for much higher power output than the devices of Field or Dionne.

In another exemplary aspect, an embodiment of the present disclosure may provide an electron beam device serving as an electromagnetic amplifier comprising: a conductive rod, a plurality of parallel discs on said rod spaced at intervals less than their diameter, a cathode array for producing a plurality of electron beams arranged in an annular configuration around said rod and disks, and directed along said rod and coaxially thereof, a first waveguide for applying electromagnetic wave energy to one end of said disc and rod assembly to induce propagation of said energy along said assembly, in which the direction of electromagnetic energy propagation is the same as that of the electron beam propagation, and a second waveguide for extracting said electromagnetic energy from the other end of said assembly. This exemplary embodiment may further include a means for producing the plurality of relativistic electron beams including the use of field emission cathodes; and in which the means for producing the plurality of relativistic electron beams includes the use of either (i) thermionic cathodes or (ii) emission cathodes. Further in this example, the direction of electromagnetic energy propagation is opposite to that of the electron beam propagation. Further, this example may have a pair of input waveguides and a pair of output waveguides. Further, in this example the disk and rod assembly may be fabricated from either silicon carbide or graphite and wherein an outer wall contains a layer of the silicon carbide or graphite.

In another exemplary aspect, an embodiment of the present disclosure may provide a coaxial amplification device comprising: a traveling wave tube having a first end and a second end; a cathode assembly adjacent the first end having a plurality of cathodes arranged in an array, wherein each cathode generates an electron beam, respectively; an input first waveguide adjacent the first end inputting an electromagnetic wave; and an output second waveguide adjacent the second end outputting the electromagnetic wave; wherein each electron beam and the electromagnetic wave propagate generally parallel between the input first waveguide and the output second waveguide, and wherein energy from each electron beam is transferred to the electromagnetic wave to amplify the electromagnetic wave as the electromagnetic wave propagates between the input first waveguide and the output second waveguide.

In yet another exemplary aspect, an embodiment of the present disclosure may provide a method comprising the steps of: providing a traveling wave tube having a plurality of cathodes arranged in an array, an input waveguide, and an output waveguide; generating an electron beam at each one of the cathodes arranged in the array; sending an electromagnetic wave through the input waveguide; propagating, simultaneously, the electromagnetic wave and each electron beam along the tube between the input wave guide and output waveguide to transfer energy from each electron beam to the electromagnetic wave, thereby amplifying the electromagnetic wave; and recovering the amplified electromagnetic wave at the output waveguide. This method may additionally include the steps of connecting an electron beam first module with an electron beam second module such that the electron beams is contiguous from the cathode, through the two modules, to a beam dump; inputting the electromagnetic wave in the first module; preventing the direct coupling of the electromagnetic wave to the second module at a sever section; and inputting the electromagnetic wave in the second module, wherein this step is accomplished by a current modulator to create AC current modulations on the electron beam.

In another aspect, an embodiment of the present disclosure may provide a coaxial amplifier having at least one electron beam. The amplifier may include a conductive rod, a plurality of parallel discs on the rod, a cathode array for producing at least one electron beam. When a plurality of electron beams are formed they are arranged in an annular configuration around said rod and disks, and directed along said rod and coaxially thereof. A first waveguide may apply electromagnetic wave energy to one end of said disc and rod assembly to induce propagation of said energy along said assembly. A second waveguide may extract the amplified electromagnetic energy from the other end of the disc and rod assembly.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

Similar numbers refer to similar parts throughout the drawings.

DETAILED DESCRIPTION

Figure 1:
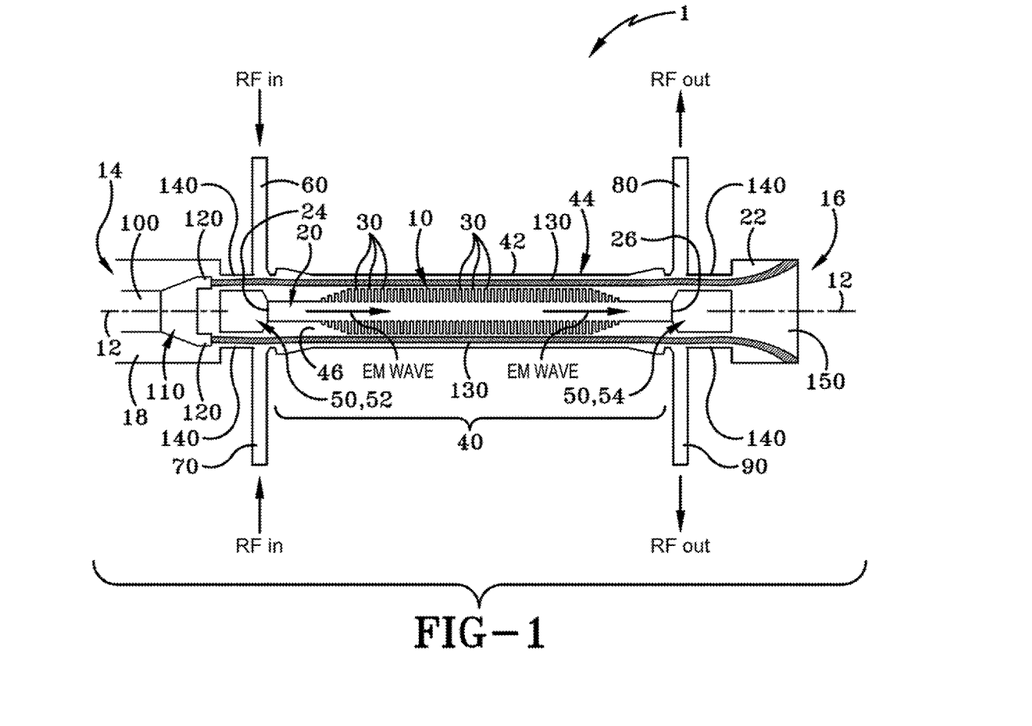
FIG. 1 is a cross-sectional representation of a six-beam coaxial multi-beam amplifier assembly utilizing rectangular waveguide connections for injecting and extracting electromagnetic waves.
Figure 2:
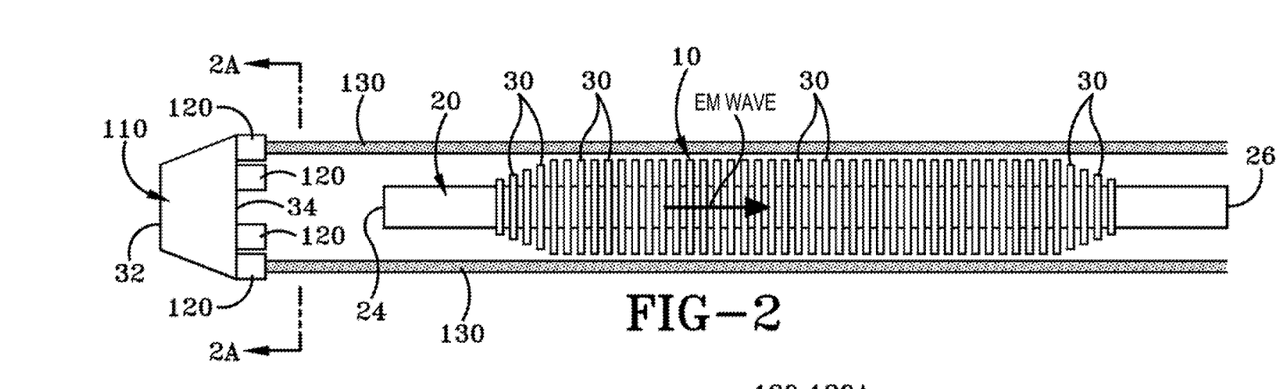
FIG. 2 is a depiction of the 6-beam cathode array positioning with respect to the disk-on-rod slow wave structure.
Figure 2A:
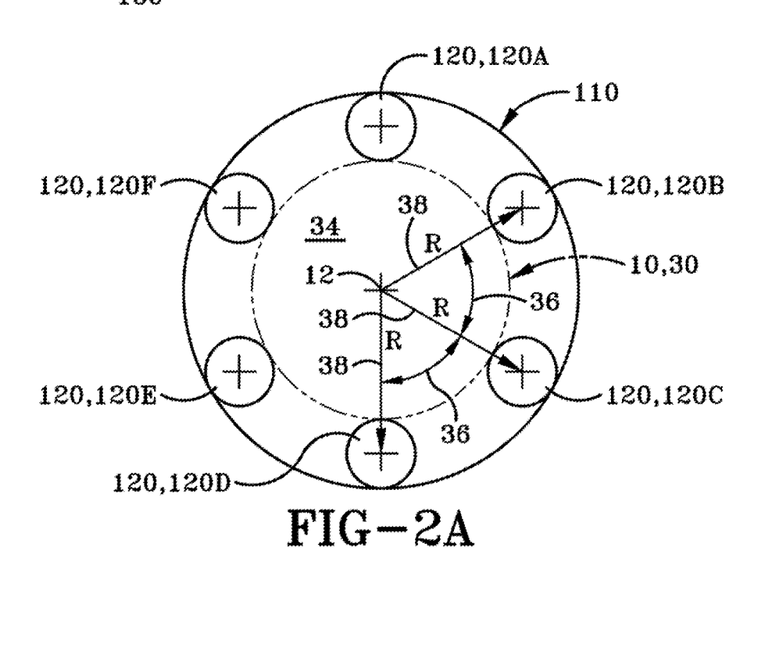
FIG. 2A is a view taken along line 2A-2A in FIG. 2 depicting an elevation view of the 6-beam cathode array.
Figure 3:
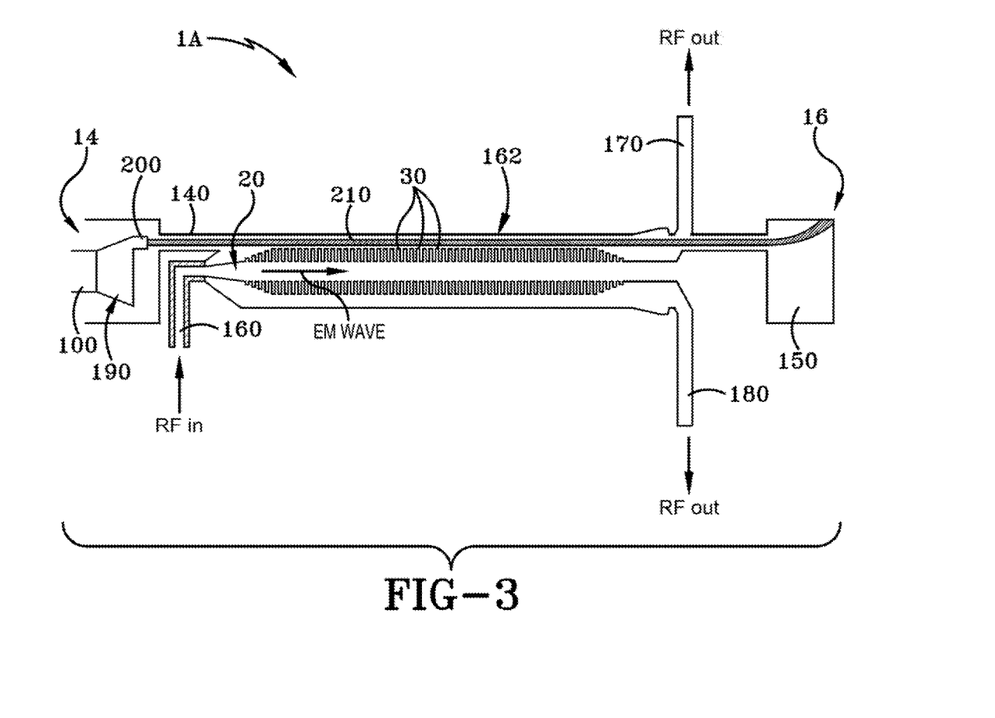
FIG. 3 is a cross-sectional representation of a seven-beam coaxial multi-beam amplifier assembly utilizing coaxial waveguide connections for the injected wave and a rectangular waveguide connection for the extracted electromagnetic wave.
Figure 4:
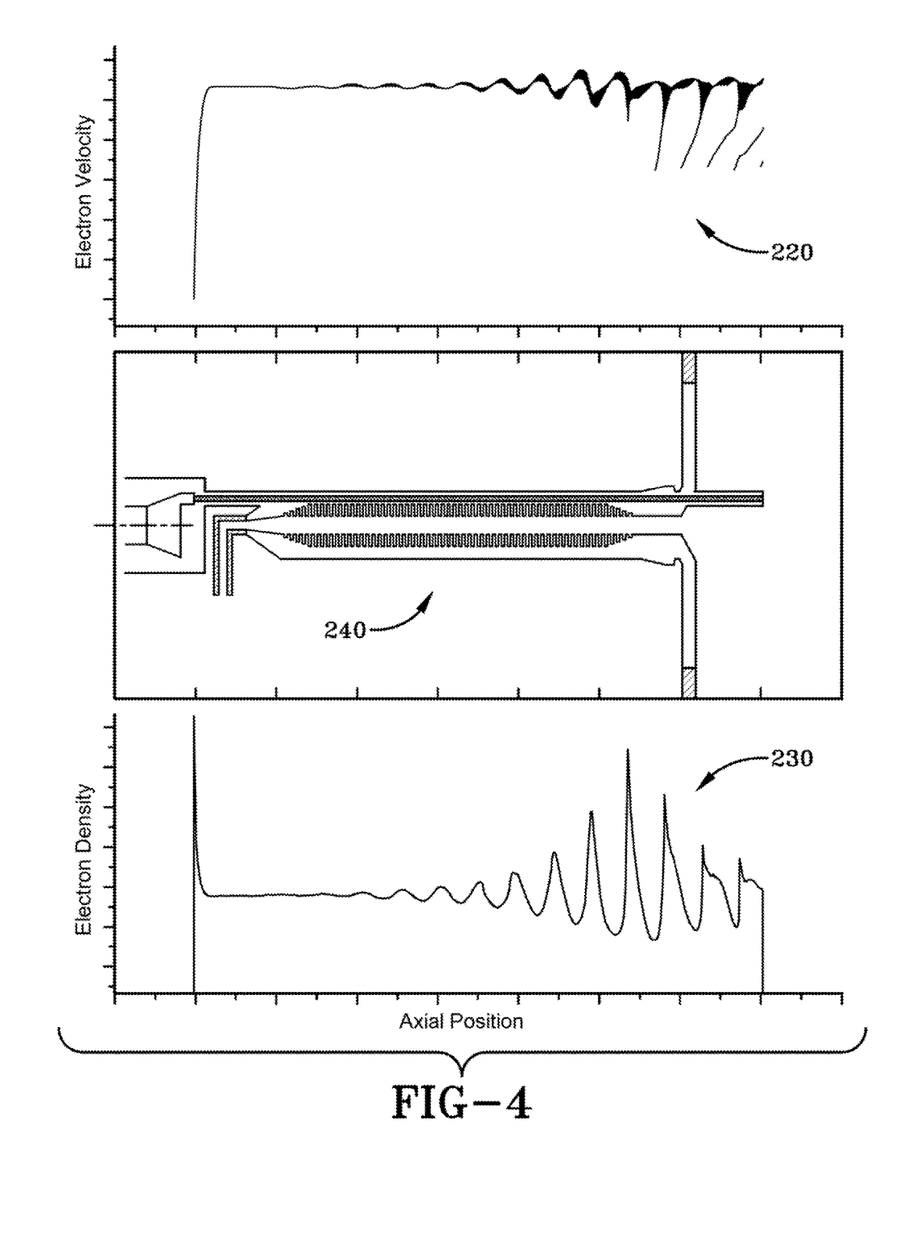
FIG. 4 is a set of plots for simulated electron velocity and electron density, referenced to axial position along the device depicted in FIG. 3.
Figure 8:
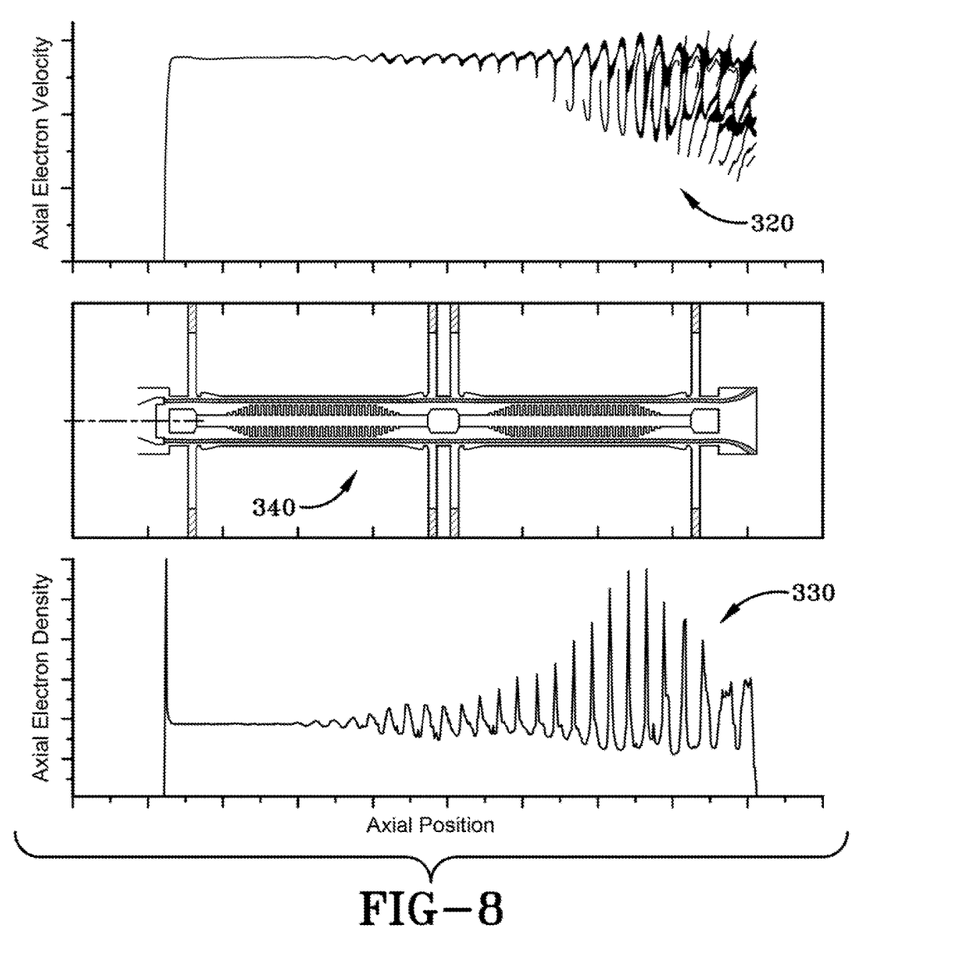
FIG. 8 is a set of plots for simulated electron velocity and electron density, referenced to axial position along the device depicted in FIG. 5.
Figure 9:
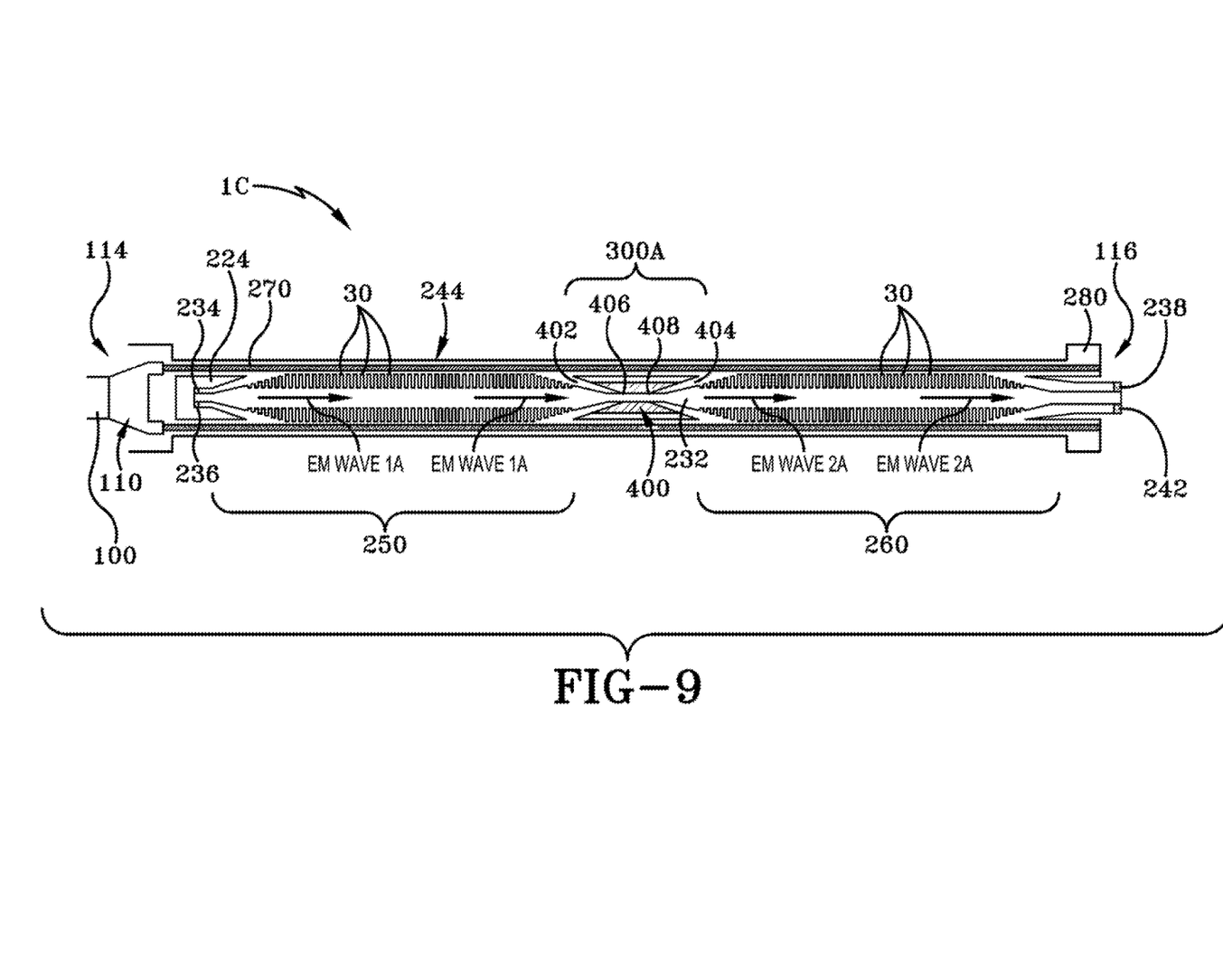
FIG. 9 is a cross-sectional representation of a modular amplification device similar to that of FIG. 5 but with a tapered load at a sever section.

One aspect of a coaxial amplification device is depicted in FIG. 1 through FIG. 2A as device 1; in FIG. 3 through FIG. 4 as device 1A; and FIG. 5 through FIG. 8 as device 1B; and in FIG. 9 as device 1C. Coaxial amplifier device 1 may include a wave structure 10, a conductive rod 20, conductive discs 30, a central coaxial section 40, a microwave vacuum tube 44, a pair of transformers 50, a first RF input waveguide 60, a second RF input waveguide 70, a first RF output waveguide 80, a second RF output waveguide 90, a transmission line 100, a cathode assembly 110 having an array of cathodes 120, and a beam collector 150 acting as an anode.

With continued reference to FIG. 1, microwave vacuum tube 44 includes an outer wall 42 defining an inner vacuum bore 46. Microwave vacuum tube 44 is aligned longitudinally and central axis or centerline 12 of the coaxial device 1 and defines center coaxial section 40. Vacuum tube 44 includes a first end 14 spaced apart from a second end 16 extending centrally along longitudinal center axis 12. Vacuum tube 44 includes a cathode receiving area 18 positioned towards first end 14 from center coaxial section 40. An anode receiving area 22 is disposed towards second end 16 relative to center coaxial section 40.

With continued reference to FIG. 1, wave structure 10 may be a slow wave structure having structurally supportive conductive rod 20 which includes a first end 24 spaced apart from a second end 26 and is aligned centrally along central axis 12 such that the longitudinal axis of rod 20 is concentric with central axis 12. Rod 20 may be generally cylindrical nature or may have other geometric configurations in cross section. First end 24 of rod 20 is electrically connected to a first transformer 52 from the pair of transformers 50. This connection may be accomplished directly, via a wire, or through another known electrical connection. The second end 26 of conductive rod 20 is electrically connected to a second transformer 54 of the pair of transformers 50. Similarly, this connection may be accomplished directly, via a wire, or through another known electrical connection. First transformer 52 is disposed closer to first end 14 relative to second transformer 54. Second transformer 54 is disposed closer to second end 16 relative to first transformer 52. In one particular embodiment, first transformer 52 and second transformer 54 are each centered about central axis 12, however there may be an instance where this is not the case. First transformer 52 is disposed closer to second end 16 than cathode assembly 110 and the array of cathodes 120 thereon. Wave structure 10 may also be referred to as a traveling-wave tube (TWT).

In one particular embodiment, first transformer 52 is disposed between the first RF input waveguide 60 and the second RF input waveguide 70 when viewed in cross section. Second transformer 54 is positioned between first RF output waveguide 80 and second RF output waveguide 90 when viewed in cross section. The first and second waveguides are structures that guide electromagnetic waves. The first and second waveguides enable an electromagnetic signal to propagate with minimal loss of energy by restricting expansion to one-dimension, or two. Otherwise, without the physical constraint of a waveguide, electromagnetic signals will typically dissipate according to the inverse square law as they expand into three dimensional space. The waveguides may be constructed to carry electromagnetic waves over a wide portion of the electromagnetic spectrum, but are especially useful in the microwave and optical frequency ranges. Depending on the frequency, they can be constructed from either conductive or dielectric materials. The other waveguides referred to in this disclosure are similar structures to that of the first and second waveguides.

A beam tunnel 140 is defined between the outer wall 42 of microwave vacuum tube 44 and the first transformer 52. Another beam tunnel 140 is defined between the outer wall 42 of microwave vacuum tube 44 and the second transformer 54. As will be discussed in greater detail below, the beam tunnels are void spaces that allow electron beams and the electromagnetic waves to pass therethrough.

A plurality of conductive discs 30 are rigidly attached to stabilizing conductive rod 20. The discs 30 are concentric with stabilizing conductive rod 20. Each one of the plurality of conductive discs 30 has a diameter less than the diameter of microwave vacuum tube 44 measured across outer wall 42. Discs 30 are spaced apart from one another a distance less than the smallest diameter of any one of the discs. In one particular embodiment, the plurality of discs closer to first end 14 begin with a smaller radius and progress towards second end 16 increasing in radius until the plurality of discs 30 have a uniform radius and diameter. Then, as the plurality of discs 30 are approaching second end 16, the discs then have a decreasing diameter to provide a smooth tapered profile transition even with conductive rod 20. Between each of the plurality of discs 30 is an annularly shaped void space. The annularly shaped void space between discs 30 may be empty, or in some alternative embodiments it may be beneficial to fill the annularly shaped void space with a material different than that which is used to construct conductive discs 30, such as a non-conductive material.

As depicted in FIG. 2 and FIG. 2A, a more detailed view of the cathode assembly 110 is provided. Particularly, in FIG. 2, the cathode assembly 110 is shown relative to conductive rod 20 and the plurality of conductive discs 30. The first transformer 54 is removed from FIG. 2 in order to better detail the array of cathodes 120, however in actual practice the first transformer 54 is present. Cathode assembly 110 includes a first end 32 spaced apart from a second end 34. First end 32 of cathode assembly 110 faces first end 14 and second end 34 of cathode assembly 110 faces conductive rod 20, the plurality of conductive discs 30, and faces second end 16.

The array of cathodes 120 are electrically connected to second end 34 of cathode assembly 110. In this particular embodiment shown in FIG. 2A, six cathodes are shown as rigidly connected and electrically conductive with second surface 34 of cathode assembly 110. When observing the second end 34, cathode assembly 110 has a generally circular profile centered about central axis 12. The cathodes are spaced circumferentially around central axis 12 in a manner such that the angular distance 36 between adjacent cathodes is equal and the radius 38 from center axis 12 to each one of the cathodes is equal. Radius 38 is greater than the radius of conductive discs 30 to allow electron beam 130 generated from cathode 120 to pass along/nearby the outer edge of discs 30.

In the embodiment depicted in FIG. 2A, a first cathode 120A is positioned at the "twelve o'clock position" relative to central axis 12. A second cathode 120B is positioned in the "two o'clock position" relative to central axis 12. A third cathode 120C is positioned in the "four o'clock position" relative to central axis 12. A fourth cathode 120D is positioned at the "six o'clock position" relative to central axis 12. A fifth cathode 120E is positioned at the "eight o'clock position" relative to central axis 12. A sixth cathode 120F is positioned at the "ten o'clock position" relative to central axis 12. While device 1 is depicted as having six cathodes 120A, 120B, 120C, 120D, 120E, and 120F, it is entirely possible to have an alternate number of cathodes in an array of cathodes 120 as one having ordinary skill in the art would understand. Thus, if more cathodes 120 are added to the array, the angular distance between the cathodes decreases. And, if fewer cathodes 120 are included in the array, the angular distance between the cathodes increases. Further, while it is contemplated that the angular distance between the cathodes is equal to provide symmetry, there may be an instance where the array of cathodes is asymmetrical having varying angular distances (or even radii) relative to the other cathodes.

As will be described in greater detail below in the operational description of the present disclosure, each one of the cathodes 120A-120F emits a single electron beam 130 therefrom extending to the beam collector 150 which acts as an anode to receive each one of the respective single beams 130.

As depicted in FIG. 3, a second embodiment of a coaxial amplification device 1A has a single RF input waveguide 160, a first RF output waveguide 170, and a second RF output waveguide 180. A cathode assembly 190 includes a seventh cathode 200 configured to project a single beam 210 through a beam tunnel 140 formed in a microwave vacuum tube 162. Note, the seventh cathode 200 is the only cathode shown in cross section. The operation of the coaxial amplification device 1A will be depicted in further detail below.

Figure 5:
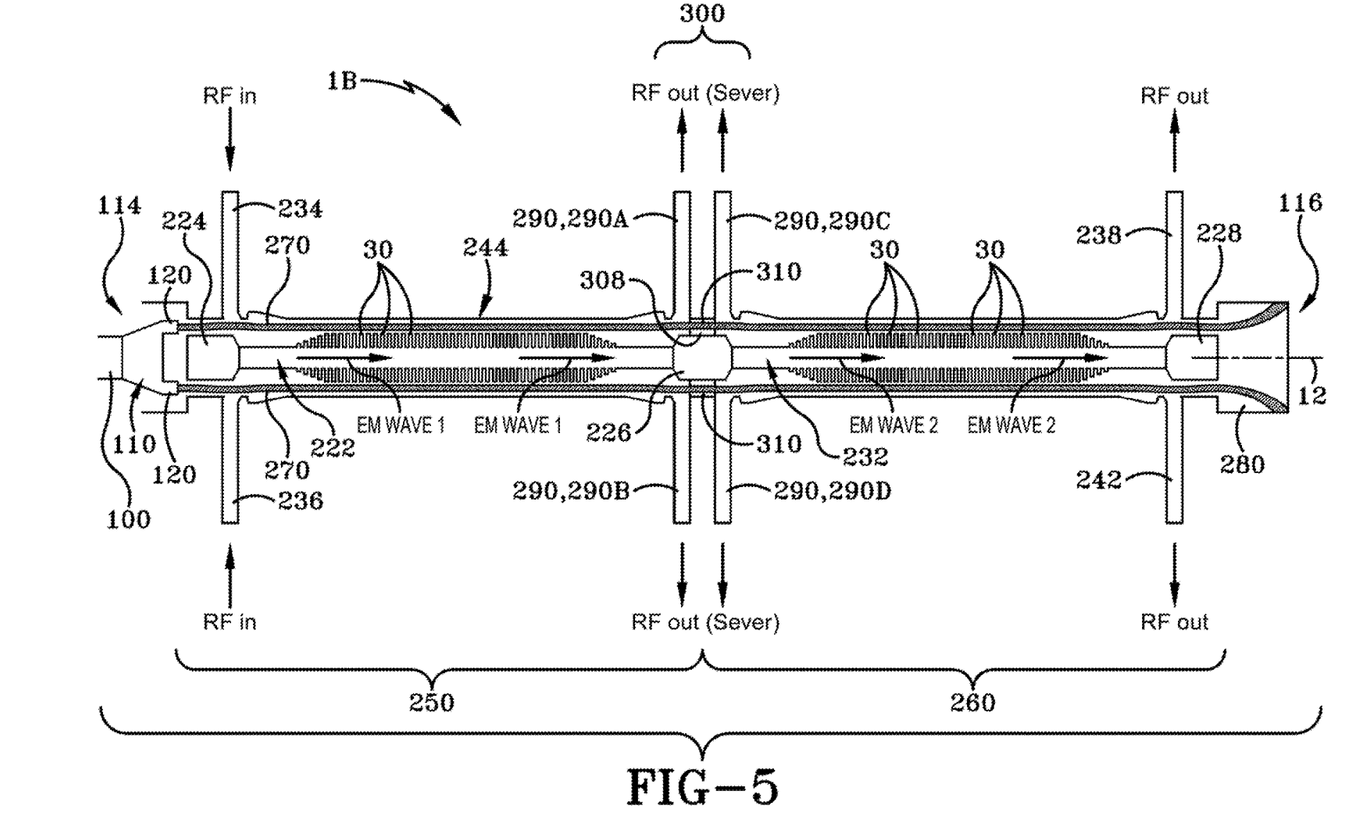
FIG. 5 is a cross-sectional representation of a six-beam coaxial multi-beam amplifier assembly consisting of two of the structures depicted in FIG. 1 coupled together, utilizing rectangular waveguide connections for the injected and extracted electromagnetic waves as well as incorporating two sets of electromagnetic sever waveguides in the center.
Figure 6:
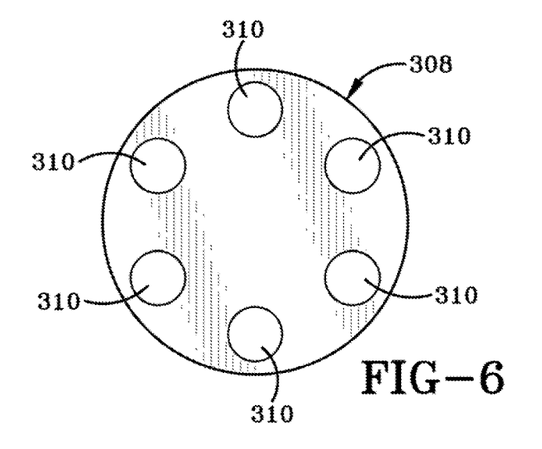
FIG. 6 is a simplified representation of the sever section of a two module amplifier, showing the passages for each of the beam.

As depicted in FIG. 5 and FIG. 6, another embodiment of a coaxial amplification device 1B includes a first end 114 spaced apart from a second end 116 defining a longitudinal axis therebetween centered about coaxial center line 12. In one particular embodiment, coaxial amplification device 1B is fabricated in modular fashion having a first module 250 and a second module 260 aligned electrically tandem and connected end-to-end such that the first end of first module 250 defines first end 114 of device 1B and the rear end or second end of second module 260 defines second end 116 of coaxial amplification device 1B. Device 1B further includes a first conductive rod 222 which is similar to that of conductive rod 20 depicted in FIG. 1. Structurally supportive first conductive rod 222 is part of first module 250 and extends between a first transformer 224 and a second transformer 226 positioned at the longitudinal center where first module 250 adjoins second module 260. A third transformer 228 is positioned opposite first transformer 224 relative to the middle second transformer 226. A second conductive rod 232 is part of the second module 260 and extends between second transformer 226 and third transformer 228. Each of the conductive rods 222, 232 have a plurality of concentric stacked discs 30 thereon and arranged in a manner similar to that as described with reference to FIG. 1.

A first RF input waveguide 234 is positioned adjacent first transformer 224. A second RF input waveguide 236 is positioned adjacent first transformer 224 and may be on opposite sides of conductive rod 222. Looking now towards the second end 116, a first terminal RF output waveguide 238 may be attached adjacent third transformer 228 and a second terminal RF output waveguide 242 may be attached adjacent third transformer 228 on opposite sides of conductive rod 232.

A sever section 300 is located at a position where first module 250 tandemly adjoins second module 260. A sever disc 308 is a generally circular member defining a plurality of apertures 310 extending from a front surface through the disc 308 to a back surface. The apertures 310 are arranged in a manner complementary and similar to that of the array of cathodes 120. As depicted in FIG. 5 and FIG. 6, there are six apertures arranged at the "twelve o'clock," "two o'clock," "four o'clock," "six o'clock," "eight o'clock," and "ten o'clock positions." In the sever section 300, there are a plurality of electromagnetic sever waveguides 290. In one particular embodiment, the plurality of sever waveguides 290 includes a first sever waveguide 290A, a second sever waveguide 290B, a third sever waveguide 290C, and a fourth sever waveguide 290D. The operational description of sever section 300 will be described in greater detail below.

As depicted in FIG. 9, another exemplary embodiment of a coaxial amplification device is shown generally as 1C. Some of the modular components of device 1C are similar to that of device 1B depicted in FIG. 5, and for brevity their description is not repeated.

Amplification device 1C includes a sever section 300A that is different than that of sever section 200 in device 1B. Sever section 300A in device 1C includes a tapered RF load 400 having an entrance 402 and an exit 404.

Tapered RF load 400 has a diameter at its entrance 402 that is at the widest portion and narrows down to a point 406. Load 400 has a uniform diameter between point 406 and point 408 which is closer to second end 116. From second point 408 to exit 404, the diameter of load 400 increases in an inversely tapering manner. The geometry associated with load 400 is optimized to attenuate the majority of the forward traveling electromagnetic EM WAVE 1A of the first module 250 and to attenuate the majority of any power contained in a backward traveling electromagnetic wave which would be in the opposite direction of EM WAVE 2A in module 260.

In accordance with one aspect, any one of the embodiments of coaxial amplification device 1, 1A, 1B, and 1C may provide an efficient tool for amplifying electromagnetic waves and microwave signals. The amplified waves and amplified signals may be more efficiently used in a variety of RF signals. Further, any one of the embodiments of coaxial amplification device 1, 1A, 1B, and 1C may provide an improved device for amplifying electromagnetic waves and amplifying microwave signals. Further, device 1, 1A, 1B, and 1C may be used at high powers and are useful as relativistic amplifiers.

In accordance with another aspect and non-limiting advantage, the coaxial amplification device 1, 1A, 1B, and 1C has the advantage of being significantly simpler to fabricate than the corrugated outer wall configuration provide in the Yue reference (See Background). The disk-on-rod structure of device 1, 1A, 1B, and 1C can conceivably be fabricated with high precision from a solid bar using a lathe. Fabrication of outer wall corrugations would likely require complex milling and brazing operations to yield a structure of adequate precision. Additionally due to the 1/r2 electric field dependence in coaxial geometries, having the disk-loaded slow wave structure on the center conductor can be expected to allow increased coupling between the RF electric field to the beam for a given reduction in radial distance between the beam and the slow wave structure, when compared to Yue's configuration.

In accordance with another aspect and non-limiting advantage, the electron beams 130 from the cathode array interact electromagnetically with the RF wave (electromagnetic wave) traveling along the disk-on-rod slow wave structure in such a way that energy from the electron beam 130 is transferred to the electromagnetic wave, thus causing amplification of the wave as it travels through the amplification device 1, 1A, 1B, and 1C. The physics associated with the energy transfer between the electron beam and the electromagnetic wave is readily apparent to one having ordinarily skill in the art. Namely, a transverse component of the electron velocity in the electron beam and the electric vector of the electromagnetic wave must point in the same direction to get an energy transfer from the electron beam to the electromagnetic wave.

Since the structure of coaxial amplification device 1, 1A, 1B, and 1C has been provided above, as well as its (their) advantages, reference is now made to the operation and performance of the embodiments of the coaxial amplification device 1, 1A, 1B, and 1C, which is detailed below.

In operation and with respect to FIG. 1, a cross-sectional representation of a multiple beam coaxial amplifier is provided. The slow wave structure 10, formed by a conductive rod 20 and a series of conductive discs 30 lie along the center axis 12 of the device 1. The outer wall 42 of the coaxial section 40 is also fabricated from a conductive material. If distributed loss is required to suppress unwanted oscillations in the operating device, both the slow wave structure 10 and the outer wall 42 may be comprised of, or layered with, conductive or semi-conductive materials such as graphite or silicon carbide that have resistivity values greater than copper, aluminum, or other metals commonly used in microwave tubes.

The center section 40 of device 1, containing the slow wave structure 10 will be rotationally symmetric about the center axis 12 of the device 1; however, other portions of the device outside of this section are not necessarily symmetric. At either side of the device, the disk-on-rod slow wave structure 10 is connected to the tube body via a pair of impedance transformer structures 50, sometimes called doorknob transformers, that also serve to couple the electromagnetic waves traversing the slow wave structure to input waveguides 60 and 70 and to output waveguides 80 and 90. The impedance transformers themselves may simply be a direct connection between the center rod 20 and one of the walls of the waveguide structures or may have a more complex shape, such as the tapered impedance transformers 50 featured in FIG. 1.

A transmission line 100 connects a source of high voltage to the cathode assembly 110. Each of the cathodes in the array 120 emits a single beam 130 down the length of the device. In the device featured in FIG. 1, there are six such cathodes 120 (depicted as 120A, 120B, 120C, 120E, 120F, and 120G) and associated electron beams 130, only two of which appear on the cross sectional FIG. 1. Each of the electron beams 130 is provided in a beam tunnel 140 that passes through the waveguides 60, 70 and impedance first transformer 52 sections extends from the cathode section 18 to the center coaxial section 40 and then from the center section 40 of the device to the collector 150 which behaves as an anode. Spent electron beams 130 are impacted on the walls of an electron beam collector section 150. The device 1 (but also 1A, and 1B) is immersed in a generally axially-aligned magnetic field to guide the electron beams from the cathodes 120, through the device, and into the collector 150. The magnetic field may be produced in a conventionally understood manner.

In the configuration depicted in FIG. 1, the coaxial multiple beam amplifier device 1 is operating in a forward wave mode, in which the electromagnetic wave is injected in waveguides 60 and 70 and co-propagates in the same direction as the electron beams along center section 40 before being extracted into output waveguides 80 and 90. This device 1 could also be used in a backward wave mode in which the electromagnetic wave is injected into waveguides 80 and 90 and propagates in the direction opposite to that of the electron beams before being extracted at waveguides 60 and 70. Beam parameters for forward or backward wave operation will be dependent on the dispersive properties of the exact slow wave structure used in a given device. In center section 40, the electromagnetic wave and the electron beam are generally parallel. Note, the electromagnetic wave referred to throughout this disclosure is generally shown in the Figures as an Arrow labeled "EM WAVE."

To better illustrate the relative position of the cathode assembly, FIG. 2 and FIG. 2A are provided. FIG. 2 shows relative positioning of the cathode assembly 110 and individual cathodes 120 and the slow wave structure 10. These cathodes are positioned at a radius 38 from the center of the device such that the electron beams emitted by the cathodes pass along and near to the outer diameter of the disks. The cathodes 120 are also ideally angularly spaced such that the angular separation 36 between each neighboring cathode is equal. The emission portions of the cathodes are ideally field emission cathode materials such as the carbon fiber arrays, but can be other types of cathode surfaces generally used for field emission, explosive emission cathodes, or thermionic cathodes.

In operation, FIG. 3 provides a cross sectional representation of a multiple beam coaxial disk-loaded amplifier that utilizes a coaxial waveguide connection 160 to inject a electromagnetic wave into the device 1A and a pair of waveguides 170 and 180 to extract the electromagnetic wave. In this representation, the cathode assembly 190 has seven individual cathodes 200. Thus, seven beams are generated; however, only one (i.e., the seventh) cathode 200 and one beam 210 is observable in the cross-section plane. It is important to note that depending on the exact requirements for a given device, anywhere from one to a large number of beams may be utilized. Additionally, one, two, or more extraction waveguides may be utilized at each end of the amplifier for electromagnetic wave injection or extraction.

FIG. 4 shows plots from a simulation of the device 1A depicted in FIG. 3. These plots show the modulations in electron velocity 220 and in axial electron density 230. For comparison of electron beam effects with axial position within the simulated device 1A, an image of the simulated device is provided at 240. The electron beam plots 220 and 230 demonstrate behavior characteristic of the amplification of an electromagnetic wave.

In operation, a cross sectional depiction of the preferred embodiment of the coaxial amplification device 1B is provided in FIG. 5. This device 1B uses two of the coaxial disk-loaded amplifiers (device 1) depicted in FIG. 1 in a modular fashion, in which the first device or module 250 is connected to the second device or module 260 in such a way that the electron beams 270 are contiguous from the cathode, through the two modules, to the beam dump 280. The set of waveguides 290 at the center of the device 1B, labeled "RF Out (Sever)" serve as electromagnetic severs. In this function, the electromagnetic sever section 300 prevents the electromagnetic wave (EM WAVE1) from the first module 250 from directly coupling to the second module 260. Because of the presence of the electromagnetic sever 308, the input electromagnetic wave (EM WAVE 1) injected at the beginning of the device is communicated to the second module by the AC current modulations on the electron beam. The electromagnetic wave (EM WAVE 2) in the second module 260 is then output at the two output waveguides 238, 242. This may be accomplished by a current modulator. Thus, the current modulator may communicate the electromagnetic wave moving along the first module to the second module by the AC current modulations on the electron beam. The number of injection, sever, and extraction waveguides may vary, depending on how the amplifier is to be used.

The ability to include the sever section 300 in a coaxial device illustrates one exemplary benefit of device 1B. Annular electron beams would not allow for the connection points to the tube body which serve both to support the center conductive rods and allow beam passage. In the present disclosure, because the beam passages 310 are located only where each individual beam penetrates the passes through sever 308, the remaining area remains connected to the tube body. The device 1B is immersed in a generally axially-aligned magnetic field to guide the electron beams from the cathodes 120, through the device, and into the collector 280. A simplified cross section, perpendicular to that of FIG. 5, depicting the sever region 300 and showing the beam passages 310 in sever 108 is provided in FIG. 6. The beam passages 310 are large enough for each beam to traverse, but are small enough that the electromagnetic wave from either module is cut off and cannot directly couple between sections.

In operation, devices 1, 1A, and 1B permit the traveling electron beam to propagate generally parallel with the electromagnetic wave traveling from an input waveguide to an output waveguide. In one version, the electromagnetic wave and the electron beam are traveling parallel in the same direction. In another version, the electromagnetic wave and the electron beam are traveling parallel in opposite directions.

Figure 7:
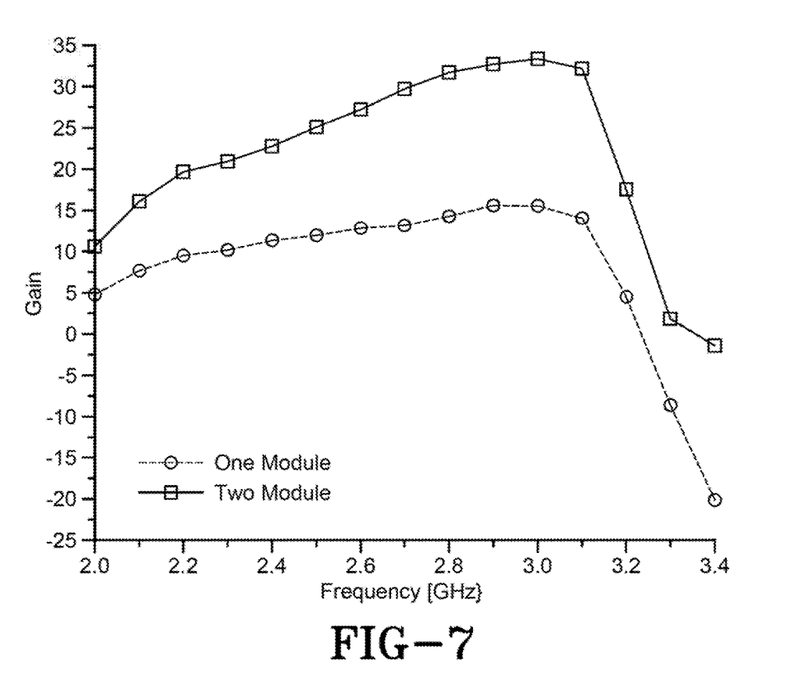
FIG. 7 is a plot comparing simulated gain from the single stage amplifier module of FIG. 1 with the simulated gain from the two stage amplifier module of FIG. 5.

Because the center sever section 300 serves both to reduce the probability of unwanted oscillations as well as increases mechanical stability of the center rod, the overall amplification structure can be longer and thus have increased gain. FIG. 7 displays a plot of simulated gain from a single module amplifier, such as that depicted in FIG. 1 (i.e., device 1) compared with a two module amplifier, as depicted in FIG. 5 (i.e. device 1B). It is possible to create amplifiers with more than two modules, but after a certain point, gain will saturate and additional device length will have no added benefit.

FIG. 8 shows plots from a simulation of the device 1B depicted in FIG. 5. These plots show the modulations in electron velocity 320 and in axial electron density 330. For comparison of electron beam effects with axial position within the simulated device, an image of the simulated device is provided 340. The electron beam plots 320 and 330 demonstrate behavior characteristic of the amplification of an electromagnetic wave.

In operation, and with respect to FIG. 9, amplification device 1C is an alternative embodiment of the present disclosure and is similar to the amplification device 18B depicted in FIG. 5, inasmuch as device 1C includes two modules 250 and 260. Amplification device 1C includes waveguides 234, 236 that inject RF power via a coaxial line, as is done in the amplification device 1A depicted in FIG. 3 with a few distinctions. Instead of the waveguide-based sever section 300, depicted in FIG. 5, the new sever section 300A comprises of a tapered RF load 400. Instead of shunting away the RF wave as is done in device 1B of FIG. 5, RF load 300A absorbs electromagnetic energy from the electromagnetic wave EM WAVE 1A. The geometry used for and conductivity of the material comprising for RF load 400 is chosen to attenuate the majority of the forward traveling electromagnetic wave of module one 250 and to attenuate the majority of any power contained in a backward traveling electromagnetic wave (opposite of EM WAVE 2A) in module two 260.

This sever 300A will serve similar function of the sever section 300 in FIG. 5. That is, the RF wave (EM WAVE 1A) injected at 234, 236 electromagnetically couples to the electron beam 270 and induces current modulations in the beam 270. As the wave EM WAVE 1A and the beam 270 co-propagate down section 250, the electromagnetic wave EM WAVE 1A is amplified and the beam modulations grow. When the sever section 300A is encountered, the wave EM WAVE 1A is attenuated, but the modulated electron beams 270 pass through into the second module/section 260. In the second module 260, the beam 270 modulations electromagnetically couple to the slow wave structure 232 and induce an electromagnetic wave EM WAVE 2 that is stronger than the original signal, injected at 234, 236, that is then further amplified as it co-propagates with the beam 270 along second module 260.

Reflections from the output section of second module 260 may result from impedance mismatches in the output section or other portions within the tube. Additionally, the beam may couple to unwanted backward wave modes (modes in which the electromagnetic wave propagates in the opposite direction as the beam; which would be a wave traveling towards the left in FIG. 9), depending on the electromagnetic dispersion properties of the slow wave structure. The sever section 300A helps to attenuate backward-traveling reflections and other unwanted electromagnetic modes, thus helping to ensure stable operation of the amplifier.

At the output end of the device 1C, the beams 270 are terminated by some means (such as impact with the wall) in the beam dump section 280. The amplified wave 270 is extracted through a coaxial waveguides 238, 242. The electromagnetic wave extracted via coaxial waveguides 238, 242 can be directly applied to an antenna or other suitable load, can be transported through a longer section of waveguide to a suitable load, or can be connected to an impedance transformer and directed through rectangular waveguides, such as done in the device depicted in FIG. 5.

The potential benefit of this variant of the device is that the complexity of the waveguide hardware of section 300 of the device in FIG. 5 can be eliminated, potentially making the magnetic field coils or permanent magnet structures, needed to generate the axially oriented magnetic field, less complex.

After the amplified electromagnetic wave has been amplified due to its interaction with the electron beam and extract at one of output waveguides, the amplified electromagnetic wave may be coupled a logic implanting device that processes the amplified electromagnetic wave in a useful manner, as one having ordinary skill in this art would understand. The term "logic", as used herein, refers to and includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

As used herein, the term electromagnetic waves refers to a form of electromagnetic radiation which a form of radiant energy released by certain electromagnetic processes. The electromagnetic waves referred to herein are synchronized oscillations of electric and magnetic fields that propagate at the speed of light. The oscillations of the two fields are perpendicular to each other and perpendicular to the direction of energy and wave propagation, forming a transverse wave. The electromagnetic waves referred to herein are characterized by either the frequency or wavelength of their oscillations to form the electromagnetic spectrum, which includes, in order of increasing frequency and decreasing wavelength: radio waves, microwaves, infrared radiation, visible light, ultraviolet radiation, X-rays and gamma rays. The electromagnetic waves referred to herein may be produced when charged particles are accelerated, and these waves can subsequently interact with any charged particles. The electromagnetic waves referred to herein may carry energy, momentum and angular momentum away from their source particle and can impart those quantities to matter with which they interact.

In the foregoing description, certain terms have been used for brevity, clearness, and understanding. No unnecessary limitations are to be implied therefrom beyond the requirement of the prior art because such terms are used for descriptive purposes and are intended to be broadly construed. Moreover, the description and illustrations of the disclosure are an example and the disclosure is not limited to the exact details shown or described.

What is claimed:

1. A coaxial amplification device comprising:
   a traveling wave tube having a first end and a second end;
   a cathode assembly adjacent the first end having a plurality of cathodes arranged in an array, wherein each one of the plurality of cathodes generates an electron beam, respectively;
   an input first waveguide adjacent the first end inputting an electromagnetic wave; and
   an output second waveguide adjacent the second end outputting the electromagnetic wave;
   wherein each electron beam and the electromagnetic wave propagate generally parallel between the input first waveguide and the output second waveguide, and wherein energy from each electron beam is transferred to the electromagnetic wave to amplify the electromagnetic wave as the electromagnetic wave propagates between the input first waveguide and the output second waveguide.

2. The coaxial amplification device of claim 1, further comprising:
   a conductive rod within the tube and a plurality of discs fixedly secured along the conductive rod length.

3. The coaxial amplification device of claim 2, further comprising:
   a first transformer and a second transformer, wherein the conductive rod is electrically connected to the first transformer at one end and electrically connected to the second transformer at the other end.

4. The coaxial amplification device of claim 3, wherein the array of cathodes are in an annular configuration around a longitudinal centerline, further comprising:
   a cathode radius distance measured from the centerline to each cathode, wherein the cathode radius is larger than a disc radius associated with the plurality of discs attached to the conductive rod aligned along the centerline.

5. The coaxial amplification device of claim 4, further comprising:
   an angular spaced distance between each one of the cathodes in the array, wherein angular spaced distance is equal between all cathodes.

6. The coaxial amplification device of claim 4, further comprising:
   a first module having first and second ends;
   a second module having first and second;
   a sever section, wherein the second end of the first module is connected to the sever section and the first end of the second module is connected to the sever section.

7. The coaxial amplification device of claim 6, further comprising:
   a sever disc at positioned at the sever section defining a plurality of apertures through the sever disc arranged in a manner complementary and similar to that of the array of cathodes.

8. The coaxial amplification device of claim 7, further comprising:
   an output sever waveguide positioned at the sever section serving as an electromagnetic sever to prevent the electromagnetic wave from directly coupling from the first module to the second module.

9. The coaxial amplification device of claim 8, further comprising:
   a current modulator that communicates the electromagnetic wave moving along the first module to the second module by AC current modulations imparted on the electron beam.

10. The coaxial amplification device of claim 9, further comprising:
    wherein the first conductor rod is within the first module;
    a second conductive rod in the second module on an opposite side of the sever section from the first conductive rod in the first module; and
    wherein the server disc in the sever section is adapted to reduce the probability of unwanted oscillations and adapted to increases mechanical stability of the first and second conductive rods allowing for a longer amplification device to increase gain.

11. The coaxial amplification device of claim 10, further comprising:
   an output third waveguide adjacent the output second waveguide near the second end.

12. The coaxial amplification device of claim 11, further comprising:
   an input fourth waveguide adjacent the input first waveguide near the first end.

13. The coaxial amplification device of claim 12, further comprising:
   a disc radius associated with each one of the plurality of discs and the discs spaced from each other a distance less than the radius.

14. The coaxial amplification device of claim 13, wherein each cathode in the array is selected from the group comprising: (i) field emission cathodes and (ii) thermionic cathodes.

15. The coaxial amplification device of claim 6, further comprising a tapered load at the sever section.

16. The coaxial amplification device of claim 1, further comprising:
   wherein each electron beam propagates in a first direction and the electromagnetic wave propagates in the same direction parallel to the electron beam.

17. The coaxial amplification device of claim 1, further comprising:
   wherein each electron beam propagates in a first direction and the electromagnetic wave propagates in an opposite second direction parallel to the electron beams.

18. The coaxial amplification device of claim 1, wherein the plurality of cathodes arranged in the array includes:
   a first cathode;
   a second cathode;
   a third cathode;
   a fourth cathode;
   a fifth cathode; and
   a sixth cathode;
   wherein the six cathodes are arranged circumferentially around a center of the cathode assembly.

19. A method comprising the steps of:
   providing a traveling wave tube having a plurality of cathodes arranged in an array, an input waveguide, and an output waveguide;
   generating an electron beam at each one of the cathodes arranged in the array, respectively;
   sending an electromagnetic wave through the input waveguide;
   propagating, simultaneously, the electromagnetic wave and each electron beam along the tube between the input wave guide and output waveguide to transfer energy from each electron beam to the electromagnetic wave, thereby amplifying the electromagnetic wave; and
   recovering the amplified electromagnetic wave at the output waveguide.

20. The method of claim 19, further comprising the steps of:
   connecting an electron beam first module with an electron beam second mod such that the electron beams is contiguous from the cathode, through the two modules, to a beam dump;
   inputting the electromagnetic wave in the first module;
   preventing the direct coupling of the electromagnetic wave to the second module at a sever section; and
   inputting the electromagnetic wave in the second module, wherein this step is accomplished by a current modulator to create AC current modulations on the electron beam.

* * * * *